United States Patent
Hwang

(10) Patent No.: US 10,091,450 B2
(45) Date of Patent: Oct. 2, 2018

(54) COUNT CIRCUIT, METHOD FOR DRIVING COUNT CIRCUIT, AND IMAGE SENSOR INCLUDING COUNT CIRCUIT

(71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/484,956

(22) Filed: Apr. 11, 2017

(65) Prior Publication Data

US 2018/0091753 A1    Mar. 29, 2018

(30) Foreign Application Priority Data

Sep. 23, 2016  (KR) .................. 10-2016-0122165

(51) Int. Cl.
 *H04N 5/378* (2011.01)
 *H03K 23/00* (2006.01)

(52) U.S. Cl.
 CPC ........... *H04N 5/378* (2013.01); *H03K 23/002* (2013.01)

(58) Field of Classification Search
 CPC ............................ H04N 5/378; H04N 5/3575
 See application file for complete search history.

(56) References Cited

U.S. PATENT DOCUMENTS

2011/0248145 A1\* 10/2011 Tanaka .................. H03M 1/144
                                                      250/208.1
2015/0028190 A1\* 1/2015 Shin ....................... H03K 21/38
                                                      250/208.1

FOREIGN PATENT DOCUMENTS

KR        1020150020432         2/2015

\* cited by examiner

*Primary Examiner* — Ahmed A Berhan
(74) *Attorney, Agent, or Firm* — IP & T Group LLP

(57) ABSTRACT

A count circuit includes a count block suitable for generating count code signals for a predetermined count period including a first period and a second period; and a storage block suitable for storing first bit signals among a plurality of bit signals included in the count code signals, for the first period, and storing remaining bit signals among the plurality of bit signals for the second period.

19 Claims, 7 Drawing Sheets

COUNT CIRCUIT, METHOD FOR DRIVING COUNT CIRCUIT, AND IMAGE SENSOR INCLUDING COUNT CIRCUIT

CROSS-REFERENCE TO RELATED APPLICATION

This application claims priority under 35 U.S.C. § 119 to Korean Patent Application No. 10-2016-0122165 filed on Sep. 23, 2016 in the Korean Intellectual Property Office, the disclosure of which is incorporated herein by reference in its entirety.

TECHNICAL FIELD

Exemplary embodiments relate to a semiconductor design technology, and more particularly, to a count circuit, a method for driving the count circuit and an image sensor including the count circuit.

DISCUSSION OF THE RELATED ART

A count circuit may be used in various electronic devices to convert valid physical properties such as intensity of light, intensity of sound, time and so forth.

For example, an electronic device such as an image sensor as a device which obtains an image by using the characteristic of a semiconductor reacting to incident light includes an analog-to-digital converter for converting the analog signal outputted from a pixel array, into a digital signal. The analog-to-digital converter may be realized to include a count circuit which performs a counting operation by using a clock signal.

The operation speed and power consumption of a count circuit exerts a direct influence on the performance of a device or a system which includes the count circuit.

For example, the number of count circuits included in an image sensor increases depending on the resolution of the image sensor. As the number of count circuits increases, the operation speed and power consumption of each count circuit may serve as an important factor that determines the overall performance of the image sensor.

For reference, an image sensor is a device which captures an image by using the characteristic of a semiconductor reacting to light. Image sensors may be generally divided into an image sensor using a charge coupled device (CCD) and an image sensor using a complementary metal oxide semiconductor (CMOS). Recently, an image sensor using a CMOS is widely used attributable to an advantage provided due to the fact that analog and digital control circuits may be directly realized in one integrated circuit (IC).

SUMMARY

Various embodiments are directed to a count circuit with optimized power consumption, a method for driving the count circuit, and an image sensor including the count circuit.

In an embodiment, a count circuit may include: a count block suitable for generating count code signals for a predetermined count period including a first period and a second period; and a storage block suitable for storing first bit signals among a plurality of bit signals included in the count code signals, for the first period, and storing remaining bit signals among the plurality of bit signals for the second period.

The second period may include the first period.

The first period may include a predetermined period corresponding to a transition time of a count target signal in the count period, and the second period may include at least a period earlier than the transition time in the count period.

The first bit signals may be lower bit signals which have relatively high frequencies, respectively, and the remaining bit signals may be upper bit signals which have relatively low frequencies, respectively.

The storage block may include: a controller suitable for generating a first control signal which is activated for the first period and a second control signal which is activated for the second period, based on a count target signal; a plurality of first storage units, each suitable for storing the first bit signals based on the first control signal, respectively; and a plurality of second storage units, each suitable for storing the remaining bit signals based on the second control signal, respectively.

The controller may include: a first control signal generation unit suitable for generating the first control signal which is activated for the first period corresponding to a transition time of the count target signal, based on the count target signal; and a second control signal generation unit suitable for generating the second control signal which is activated for the second period including at least a period earlier than the transition period, based on the first control signal.

The controller may include: a first control signal generation unit suitable for generating the first control signal which is activated for the first period corresponding to a transition time of the count target signal, based on the count target signal; a third control signal generation unit suitable for generating a third control signal which is activated for the second period including at least a period earlier than the transition period, based on the first control signal; and a selection unit suitable for selectively selecting any one of the first control signal and the third control signal as the second control signal, based on a mode select signal.

In an embodiment, a method for driving a count circuit may include: entering a first mode; generating count code signals for a predetermined first count period; storing some bit signals among a plurality of bit signals included in the count code signals, for a predetermined period corresponding to a first transition time of a count target signal in the first count period; and storing remaining bit signals among the plurality of bit signals, for at least a period earlier than the first transition time in the first count period.

The some bit signals may include lower bit signals which have relatively high frequencies, respectively, and the remaining bit signals may include upper bit signals which have relatively low frequencies, respectively.

The storing of the some bit signals may include: generating a first control signal which is activated for a first period of the first count period, based on the count target signal; and enabling a first storage block to store the some bit signals, for the first period, based on the first control signal.

The storing of the remaining bit signals may include: generating a second control signal which is activated for a second period of the first count period, based on the first control signal; and enabling a second storage block to store the remaining bit signals, for the second period, based on the second control signal.

The method may further include: entering a second mode; generating the count code signals for a predetermined second count period; and storing the plurality of bit signals for a predetermined period corresponding to a second transition time of the count target signal in the second count period.

The storing of the plurality of bit signals may include: generating a first control signal which is activated for the predetermined period corresponding to the second transition time, based on the count target signal; enabling a first storage block to store the some bit signals, for a first period of the second count period, based on the first control signal; generating a third control signal which is activated for a second period of the second count period, based on the first control signal; outputting the first control signal between the first control signal and the third control signal, as a second control signal, based on a mode select signal; and enabling a second storage block to store the remaining bit signals, for the first period, based on the second control signal.

In an embodiment, an image sensor may include: a pixel circuit suitable for generating a plurality of pixel signals; a ramp signal generation circuit suitable for generating a ramp signal; a signal conversion circuit suitable for generating a plurality of count target signals based on the plurality of pixel signals and the ramp signal; and a count circuit suitable for generating common count code signals, storing first bit signals among a plurality of bit signals included in the common count code signals, for a predetermined period corresponding to a transition time of each of the plurality of count target signals, and storing remaining bit signals among the plurality of bit signals, for at least a period earlier than the transition time, based on the plurality of count target signals.

The earlier period may include the predetermined period.

The first bit signals may include lower bit signals which have relatively high frequencies, respectively, and the remaining bit signals may include upper bit signals which have relatively low frequencies, respectively.

The count circuit may include: a count block suitable for generating the common count code signals for a predetermined count period; and a plurality of storage blocks suitable for storing the common count code signals, based on the plurality of count target signals.

Each of the plurality of storage blocks may include: a controller suitable for generating a first control signal which is activated for the predetermined period and a second control signal which is activated for the earlier period, based on each of the plurality of count target signals; a first storage suitable for storing the first bit signals based on the first control signal; and a second storage and suitable for storing the remaining bit signals based on the second control signal.

The controller may include: a first control signal generation unit suitable for generating the first control signal based on the plurality of count target signals; and a second control signal generation unit suitable for generating the second control signal based on the first control signal.

The count circuit may store the remaining bit signals for the earlier period or for the predetermined period, based on a mode select signal.

DETAILED DESCRIPTION

Figure 1:
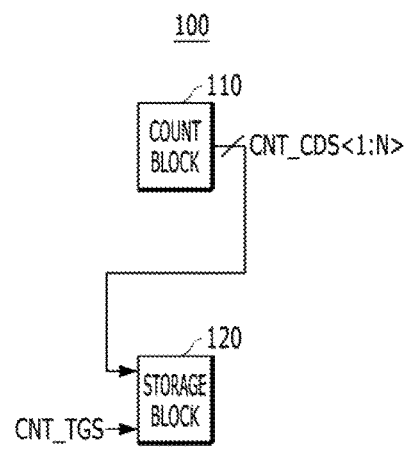
FIG. 1 is a diagram illustrating a count circuit in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

FIG. 1 is a diagram illustrating a count circuit 100 in accordance with a first embodiment.

Referring to FIG. 1, the count circuit 100 may include a count block 110 and a storage block 120.

The count block 110 may generate count code signals CNT_CDS<1:N> for a predetermined count period. For example, although not shown in the drawing, the count block 110 may generate the count code signals CNT_CDS<1:N> based on an enable signal corresponding to the count period. The count code signals CNT_CDS<1:N> may include a plurality of bit signals. Hereafter, the count code signals CNT_CDS<1:N> will be referred to as first to $N^{th}$ bit signals CNT_CDS<1:N> (where N is a natural number). Further, first to $M^{th}$ bit signals CNT_CDS<1:M> among the first to $N^{th}$ bit signals CNT_CDS<1:N>, which have relatively high frequencies, will be referred to as first to $M^{th}$ lower bit signals CNT_CDS<1:M>, and first to $X^{th}$ bit signals CNT_CDS<M+1:N> among the first to $N^{th}$ bit signals CNT_CDS<1:N>, which have relatively low frequencies, will be referred to as first to $X^{th}$ upper bit signals CNT_CDS<M+1:N> (where M is a natural number smaller than N and X equals to (N−M)).

The storage block 120 may store the first to $M^{th}$ lower bit signals CNT_CDS<1:M> for a first period of the count period and store the first to $X^{th}$ upper bit signals CNT_CDS<M+1:N> for a second period of the count period, based on a count target signal CNT_TGS. In some embodiments, the first period and the second period may overlap with each other, and the second period may include the first period. For example, the first period may include a predetermined period corresponding to the transition time of the count target signal CNT_TGS, in the count period, and the second period may include at least a period earlier than the transition time, in the count period. Hereafter, the first period will be referred to as a transition period, and the second period will be referred to as an earlier period.

Figure 2:
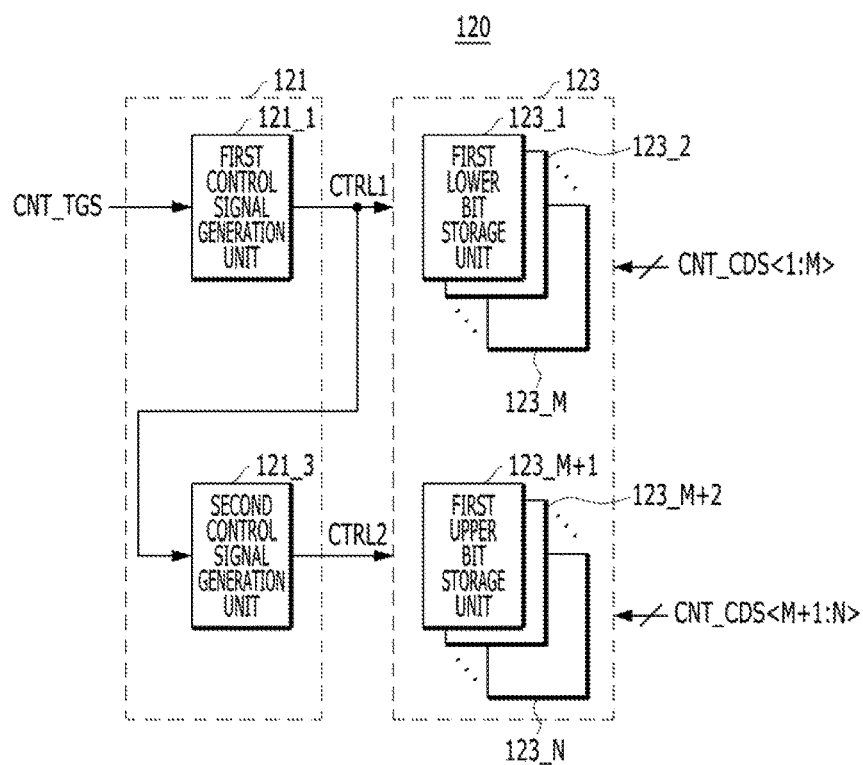
FIG. 2 is a diagram illustrating an example of a storage block shown in FIG. 1.

FIG. 2 is a diagram illustrating an example of the storage block 120 shown in FIG. 1.

Referring to FIG. 2, the storage block 120 may include a controller 121 and a storage 123.

The controller 121 may generate, based on the count target signal CNT_TGS, a first control signal CTRL1 which is activated for the transition period and a second control signal CTRL2 which is activated for the earlier period.

For example, the controller 121 may include a first control signal generation unit 121_1 and a second control signal generation unit 121_3. The first control signal generation unit 121_1 may generate the first control signal CTRL1 based on the count target signal CNT_TGS. For example, the first control signal generation unit 121_1 may include a pulse generator. The second control signal generation unit 121_3 may generate the second control signal CTRL2 based on the first control signal CTRL1. For example, the second control signal generation unit 121_3 may include a state machine.

The storage 123 may store the first to $N^{th}$ bit signals CNT_CDS<1:N> based on the first control signal CTRL1 and the second control signal CTRL2.

For example, the storage 123 may include first to $M^{th}$ lower bit storage units 123_1 to 123_M and first to $X^{th}$ upper bit storage units 123_M+1 to 123_N. The first to $M^{th}$ lower bit storage units 123_1 to 123_M may be enabled for the transition period based on the first control signal CTRL1, and store the first to $M^{th}$ lower bit signals CNT_CDS<1:M> for the transition period. The first to $X^{th}$ upper bit storage units 123_M+1 to 123_N may be enabled for the earlier period based on the second control signal CTRL2, and store the first to $X^{th}$ upper bit signals CNT_CDS<M+1:N> for the earlier period.

Figure 3:
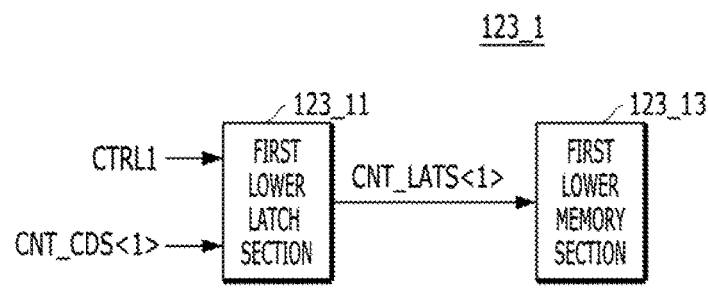
FIG. 3 is a diagram illustrating an example of a first lower bit storage unit shown in FIG. 2.

FIG. 3 is a diagram illustrating an example of the first lower bit storage unit 123_1 shown in FIG. 2.

Referring to FIG. 3, the first lower bit storage unit 123_1 may include a first lower latch section 123_11 and a first lower memory section 123_13.

The first lower latch section 123_11 may receive the first lower bit signal CNT_CDS<1> as a first lower latch signal CNT_LATS<1> based on the first control signal CTRL1 for the transition period, and latch the first lower latch signal CNT_LATS<1>. The first lower latch section 123_11 may finally latch the first lower bit signal CNT_CDS<1> corresponding to the deactivation time of the first control signal CTRL1, as the first lower latch signal CNT_LATS<1>.

The first lower memory section 123_13 may store the first lower latch signal CNT_LATS<1> for a predefined period. The predefined period may be included in the count period, or may be included in a period after the count period ends.

Meanwhile, although not shown in the drawing, the second to $M^{th}$ lower bit storage units 123_2 to 123_M and the first to $X^{th}$ upper bit storage units 123_M+1 to 123_N may have the same configuration as the first lower bit storage unit 123_1. For example, the second to $M^{th}$ lower bit storage units 123_2 to 123_M may include second to $M^{th}$ lower latch sections and second to $M^{th}$ lower memory sections, respectively, and the first to $X^{th}$ upper bit storage units 123_M+1 to 123_N may include first to $X^{th}$ upper latch sections and first to $X^{th}$ upper memory sections, respectively. Since each of the second to $M^{th}$ lower latch sections and the first to $X^{th}$ upper latch sections may have the same configuration as the first lower latch section 123_11 and each of the second to $M^{th}$ lower memory sections and the first to $X^{th}$ upper memory sections may have the same configuration as the first lower memory section 123_13, detailed descriptions thereof will be omitted.

Hereinbelow, the operation of the count circuit 100 in accordance with the first embodiment, configured as mentioned above, will be described.

The operation of the count circuit 100 in accordance with the first embodiment will be described by exemplifying, for the sake of convenience in explanation, that 6-bit count code signals, that is, first to sixth bit signals CNT_CDS<1:6> are generated and used. The first to third bit signals CNT_CDS<1:3> among the first to sixth bit signals CNT_CDS<1:6> will be referred to as first to third lower bit signals CNT_CDS<1:3>, and the fourth to sixth bit signals CNT_CDS<4:6> among the first to sixth bit signals CNT_CDS<1:6> will be referred to as first to third upper bit signals CNT_CDS<4:6>.

Figure 4:
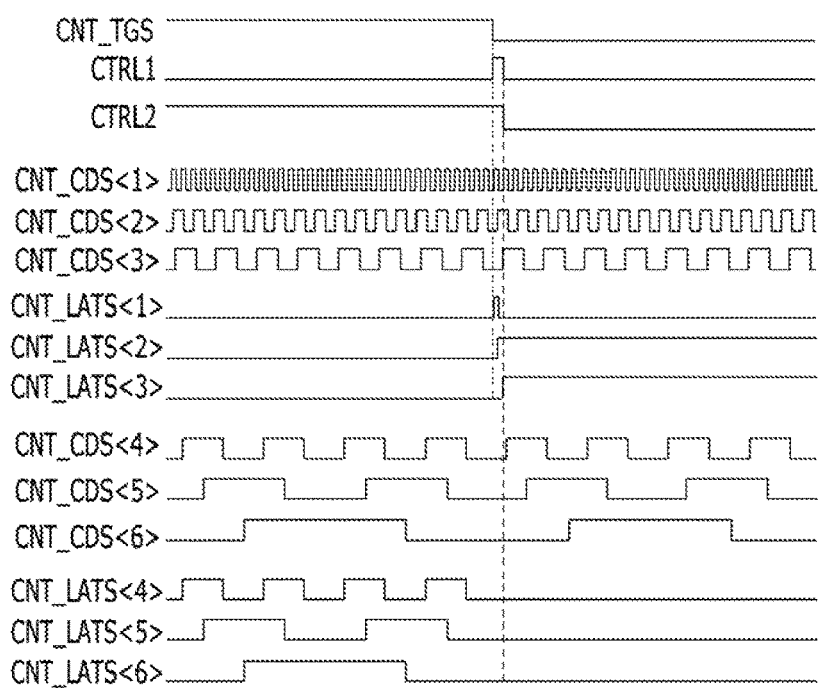
FIG. 4 is a timing diagram illustrating the operation of the count circuit shown in FIG. 1.

FIG. 4 is a timing diagram illustrating the operation of the count circuit 100 in accordance with the first embodiment.

Referring to FIG. 4, the count block 110 may generate the first to third lower bit signals CNT_CDS<1:3> and the first to third upper bit signals CNT_CDS<4:6> for the count period. The first to third lower bit signals CNT_CDS<1:3> and the first to third upper bit signals CNT_CDS<4:6> may be signals which toggle with predetermined cycles, respectively. For example, the first lower bit signal CNT_CDS<1> may toggle with a first cycle, the second lower bit signal CNT_CDS<2> may toggle with a second cycle two times longer than the first cycle, the third lower bit signal CNT_CDS<3> may toggle with a third cycle two times longer than the second cycle, the first upper bit signal CNT_CDS<4> may toggle with a fourth cycle two times longer than the third cycle, the second upper bit signal CNT_CDS<5> may toggle with a fifth cycle two times longer than the fourth cycle, and the third upper bit signal CNT_CDS<6> may toggle with a sixth cycle two times longer than the fifth cycle.

The storage block 120 may store the first to third lower bit signals CNT_CDS<1:3> for the transition period of the count period. In detail, the first control signal generation unit 121_1 may generate the first control signal CTRL1 which is activated for the transition period. For example, the first control signal CTRL1 may be activated at the transition time of the count target signal CNT_TGS, and be deactivated after a predetermined period. The predetermined period may include a substantially short period. For example, the predetermined period may be shorter than a single cycle of the first lower bit signal CNT_CDS<1> or include a minimum period so that first to third lower latch sections normally perform a latch operation. First to third lower bit storage units 123_1 to 123_3 may store the first to third lower bit signals CNT_CDS<1:3> for the transition period based on the first control signal CTRL1, respectively. For example, first to third lower latch sections may receive the first to third lower bit signals CNT_CDS<1:3> for the transition period, and latch the first to third lower bit signals CNT_CDS<1:3> as first to third lower latch signals CNT_LATS<1:3>, respectively. As the first to third lower latch sections perform the latch operation for the transition period, average power to be continuously produced for the earlier period of the count period may be minimized.

In the meantime, the storage block 120 may store the first to third upper bit signals CNT_CDS<4:6> for the earlier period of the count period. In detail, the second control signal generation unit 121_3 may generate the second control signal CTRL2 which is activated for the earlier period. For example, the second control signal CTRL2 may be activated from the initial time of the count period, and be deactivated together when the first control signal CTRL1 is deactivated. First to third upper bit storage units 123_4 to 123_6 may store the first to third upper bit signals CNT_CDS<4:6> for the earlier period based on the second control signal CTRL2, respectively. For example, the first to third upper latch sections respectively included in the first to third upper bit storage units 123_4 to 123_6 may receive the first to third upper bit signals CNT_CDS<4:6> for the earlier period, and latch the first to third upper bit signals CNT_CDS<4:6> as first to third upper latch signals CNT_LATS<4:6>, respectively. Although unnecessary power consumption may occur as the first to third upper latch sections perform a latch operation for the earlier period, since the latch operation is performed based on the first to third upper bit signals CNT_CDS<4:6> which have relatively low frequencies, no substantial influence is exerted on the average power of the count circuit. Moreover, because the first to third upper latch sections perform the latch operation from the initial time of the count period, peak power to be produced thereby along with the first to third lower latch sections may be dispersed.

As is apparent from the above descriptions, according to the first embodiment, advantages may be provided in that peak power may be minimized by dispersing storage times and average power may be minimized by controlling bit signals of relatively low frequencies to be stored from an initial time.

Figure 5:
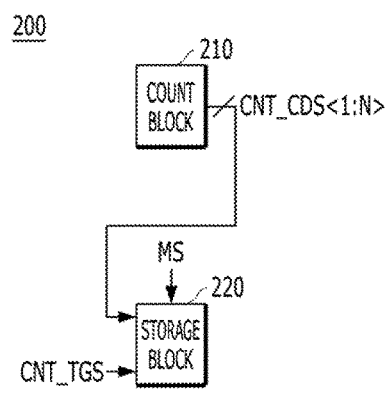
FIG. 5 is a diagram illustrating a count circuit in accordance with a second embodiment.

FIG. 5 is a diagram illustrating a count circuit 200 in accordance with a second embodiment.

Referring to FIG. 5, the count circuit 200 may include a count block 210 and a storage block 220.

The count block 210 may generate count code signals CNT_CDS<1:N> for a predetermined count period. For example, although not shown in the drawing, the count block 210 may generate the count code signals CNT_CDS<1:N> based on an enable signal corresponding to the count period and a clock signal. The count code signals CNT_CDS<1:N> may include a plurality of bit signals. Hereafter, the count code signals CNT_CDS<1:N> will be referred to as first to $N^{th}$ bit signals CNT_CDS<1:N> (where N is a natural number). Further, first to $M^{th}$ bit signals CNT_CDS<1:M> among the first to $N^{th}$ bit signals CNT_CDS<1:N>, which have relatively high frequencies, will be referred to as first to $M^{th}$ lower bit signals CNT_CDS<1:M>, and first to $X^{th}$ bit signals CNT_CDS<M+1:N> among the first to $N^{th}$ bit signals CNT_CDS<1:N>, which have relatively low frequencies, will be referred to as first to $X^{th}$ upper bit signals CNT_CDS<M+1:N> (where M is a natural number smaller than N and X equals to (N−M)).

The storage block 220 may store the first to $M^{th}$ lower bit signals CNT_CDS<1:M> for a first period of the count period and store the first to $X^{th}$ upper bit signals CNT_CDS<M+1:N> for the first period or a second period of the count period, based on a count target signal CNT_TGS and a mode select signal MS. In some embodiments, the second period may include the first period. For example, the first period may include a predetermined period corresponding to the transition time of the count target signal CNT_TGS, in the count period, and the second period may include at least a period earlier than the transition time, in the count period. Hereafter, the first period will be referred to as a transition period, and the second period will be referred to as an earlier period.

Figure 6:
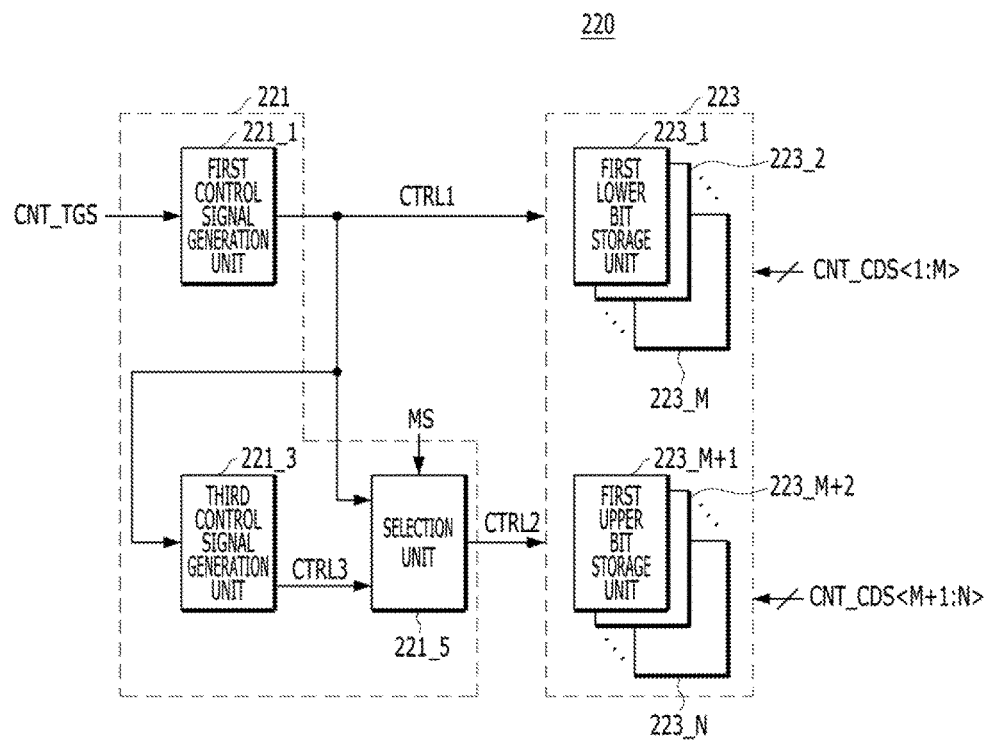
FIG. 6 is a diagram illustrating an example of a storage block shown in FIG. 5.

FIG. 6 is a diagram illustrating an example of the storage block 220 shown in FIG. 5.

Referring to FIG. 6, the storage block 220 may include a controller 221 and a storage 223.

The controller 221 may generate a first control signal CTRL1 and a second control signal CTRL2 based on the count target signal CNT_TGS and the mode select signal MS. The first control signal CTRL1 may be activated for the transition period, and the second control signal CTRL2 may be activated for the transition period or the earlier period. For example, the controller 221 may include a first control signal generation unit 221_1, a third control signal generation unit 221_3, and a selection unit 221_5. The first control signal generation unit 221_1 may generate the first control signal CTRL1 based on the count target signal CNT_TGS. For example, the first control signal generation unit 221_1 may include a pulse generator. The third control signal generation unit 221_3 may generate a third control signal CTRL3 based on the first control signal CTRL1. For example, the third control signal generation unit 221_3 may include a state machine. The selection unit 221_5 may output any one of the first control signal CTRL1 and the third control signal CTRL3 as the second control signal CTRL2 based on the mode select signal MS. For example, the selection unit 221_5 may include a multiplexer.

The storage 223 may store the first to $N^{th}$ bit signals CNT_CDS<1:N> based on the first control signal CTRL1 and the second control signal CTRL2.

For example, the storage 223 may include first to $M^{th}$ lower bit storage units 223_1 to 223_M and first to $X^{th}$ upper bit storage units 223_M+1 to 123_N. The first to $M^{th}$ lower bit storage units 223_1 to 223_M may be enabled for the transition period based on the first control signal CTRL1, and store the first to $M^{th}$ lower bit signals CNT_CDS<1:M> for the transition period. The first to $X^{th}$ upper bit storage units 223_M+1 to 223_N may be enabled for the transition period or the earlier period based on the second control signal CTRL2, and store the first to $X^{th}$ upper bit signals CNT_CDS<M+1:N> for the transition period or the earlier period.

Figure 7:
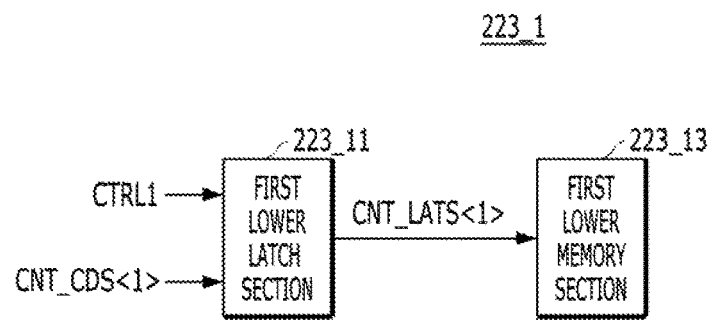
FIG. 7 is a diagram illustrating an example of a first lower bit storage unit shown in FIG. 6.

FIG. 7 is a diagram illustrating an example of the first lower bit storage unit 223_1 shown in FIG. 6.

Referring to FIG. 7, the first lower bit storage unit 223_1 may include a first lower latch section 223_11 and a first lower memory section 223_13.

The first lower latch section 223_11 may receive the first lower bit signal CNT_CDS<1> as a first lower latch signal CNT_LATS<1> based on the first control signal CTRL1 for the transition period, and latch the first lower latch signal CNT_LATS<1>. The first lower latch section 223_11 may finally latch the first lower bit signal CNT_CDS<1> corresponding to the deactivation time of the first control signal CTRL1, as the first lower latch signal CNT_LATS<1>.

The first lower memory section 223_13 may store the first lower latch signal CNT_LATS<1> for a predefined period. The predefined period may be included in the count period, or may be included in a period after the count period ends.

Meanwhile, although not shown in the drawing, the second to $M^{th}$ lower bit storage units 223_2 to 223_M and the first to $X^{th}$ upper bit storage units 223_M+1 to 223_N may have the same configuration as the first lower bit storage unit 223_1. For example, the second to M<sup>th</sup> lower bit storage units 223_2 to 223_M may include second to M<sup>th</sup> lower latch sections and second to M<sup>th</sup> lower memory sections, respectively, and the first to X<sup>th</sup> upper bit storage units 223_M+1 to 223_N may include first to X<sup>th</sup> upper latch sections and first to X<sup>th</sup> upper memory sections, respectively. Since each of the second to M<sup>th</sup> lower latch sections and the first to X<sup>th</sup> upper latch sections may have the same configuration as the first lower latch section 223_11 and each of the second to M<sup>th</sup> lower memory sections and the first to X<sup>th</sup> upper memory sections may have the same configuration as the first lower memory section 223_13, detailed descriptions thereof will be omitted.

Hereinbelow, the operation of the count circuit 200 in accordance with the second embodiment, configured as mentioned above, will be described.

The operation of the count circuit 200 in accordance with the second embodiment will be described by exemplifying, for the sake of convenience in explanation, that 6-bit count code signals, that is, first to sixth bit signals CNT_CDS<1:6> are generated and used. The first to third bit signals CNT_CDS<1:3> among the first to sixth bit signals CNT_CDS<1:6> will be referred to as first to third lower bit signals CNT_CDS<1:3>, and the fourth to sixth bit signals CNT_CDS<4:6> among the first to sixth bit signals CNT_CDS<1:6> will be referred to as first to third upper bit signals CNT_CDS<4:6>.

Figure 8:
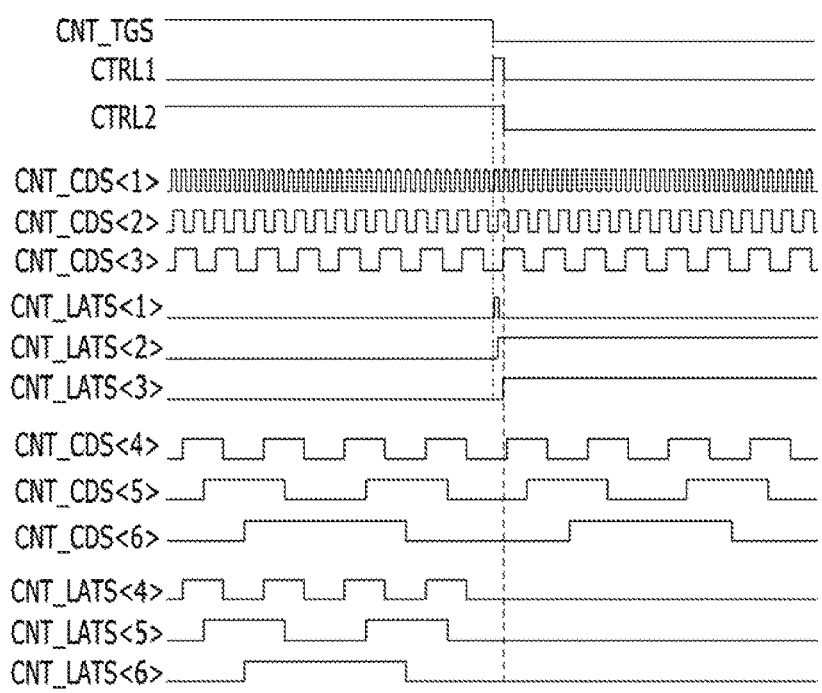
FIGS. 8 and 9 are timing diagrams illustrating the operation of the count circuit shown in FIG. 5.
Figure 9:
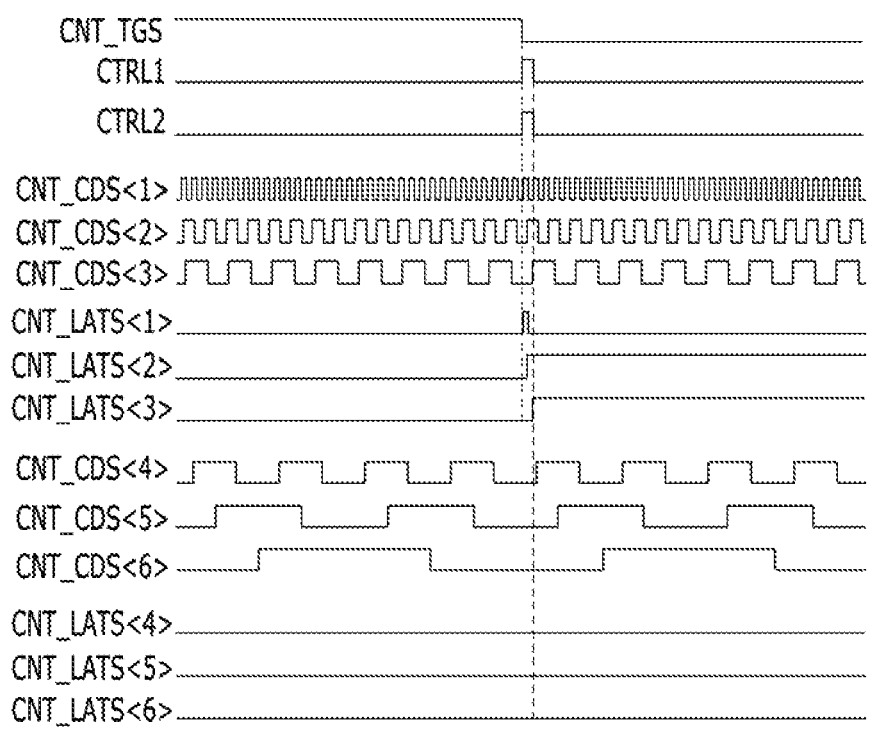

FIGS. 8 and 9 are timing diagrams illustrating the operation of the count circuit 200 in accordance with the second embodiment.

First, the operation of the count circuit 200 according to a first mode will be described below with reference to FIG. 8.

Referring to FIG. 8, the count block 210 may generate the first to third lower bit signals CNT_CDS<1:3> and the first to third upper bit signals CNT_CDS<4:6> for the count period. The first to third lower bit signals CNT_CDS<1:3> and the first to third upper bit signals CNT_CDS<4:6> may be signals which toggle with predetermined cycles, respectively. For example, the first lower bit signal CNT_CDS<1> may toggle with a first cycle, the second lower bit signal CNT_CDS<2> may toggle with a second cycle two times longer than the first cycle, the third lower bit signal CNT_CDS<3> may toggle with a third cycle two times longer than the second cycle, the first upper bit signal CNT_CDS<4> may toggle with a fourth cycle two times longer than the third cycle, the second upper bit signal CNT_CDS<5> may toggle with a fifth cycle two times longer than the fourth cycle, and the third upper bit signal CNT_CDS<6> may toggle with a sixth cycle two times longer than the fifth cycle.

The storage block 220 may store the first to third lower bit signals CNT_CDS<1:3> for the transition period of the count period. In detail, the first control signal generation unit 221_1 may generate the first control signal CTRL1 which is activated for the transition period. For example, the first control signal CTRL1 may be activated at the transition time of the count target signal CNT_TGS, and be deactivated after a predetermined period. The predetermined period may include a substantially short period. For example, the predetermined period may be shorter than a single cycle of the first lower bit signal CNT_CDS<1> or include a minimum period so that first to third lower latch sections normally perform a latch operation. First to third lower bit storage units 223_1 to 223_3 may store the first to third lower bit signals CNT_CDS<1:3> for the transition period based on the first control signal CTRL1. For example, first to third lower latch sections may receive the first to third lower bit signals CNT_CDS<1:3> for the transition period, and latch the first to third lower bit signals CNT_CDS<1:3> as first to third lower latch signals CNT_LATS<1:3>, respectively. As the first to third lower latch sections perform a latch operation for the transition period, average power to be continuously produced for the earlier period of the count period may be minimized.

In the meantime, the storage block 220 may store the first to third upper bit signals CNT_CDS<4:6> for the earlier period of the count period. In detail, the third control signal generation unit 221_3 may generate the third control signal CTRL3 which is activated for the earlier period. For example, the third control signal CTRL3 may be activated from the initial time of the count period, and be deactivated together when the first control signal CTRL1 is deactivated. The selection unit 221_5 may output the third control signal CTRL3 as the second control signal CTRL2 based on the mode select signal MS corresponding to the first mode. First to third upper bit storage units 223_4 to 223_6 may store the first to third upper bit signals CNT_CDS<4:6> for the earlier period based on the second control signal CTRL2. For example, the first to third upper latch sections respectively included in the first to third upper bit storage units 223_4 to 223_6 may receive the first to third upper bit signals CNT_CDS<4:6> for the earlier period, and latch the first to third upper bit signals CNT_CDS<4:6> as first to third upper latch signals CNT_LATS<4:6>, respectively. Although unnecessary power consumption may occur as the first to third upper latch sections perform a latch operation for the earlier period, since the latch operation is performed based on the first to third upper bit signals CNT_CDS<4:6> which have relatively low frequencies, no substantial influence is exerted on the average power of the count circuit. Moreover, because the first to third upper latch sections perform the latch operation from the initial time of the count period, peak power to be produced thereby along with the first to third lower latch sections may be dispersed.

Next, the operation of the count circuit 200 according to a second mode will be described below with reference to FIG. 9.

As shown in FIG. 9, the count circuit 200 may operate similarly to the first mode.

In the same manner as in the first mode, the count block 210 may generate the first to third lower bit signals CNT_CDS<1:3> and the first to third upper bit signals CNT_CDS<4:6> for the count period, and the storage block 220 may store the first to third lower bit signals CNT_CDS<1:3> for the transition period of the count period.

Conversely, differently from the first mode, the storage block 220 may store the first to third upper bit signals CNT_CDS<4:6> for the transition period. In detail, the selection unit 221_5 may output the first control signal CTRL1 as the second control signal CTRL2 based on the mode select signal MS corresponding to the second mode. First to third upper bit storage units 223_4 to 223_6 may store the first to third upper bit signals CNT_CDS<4:6> for the transition period based on the second control signal CTRL2, respectively.

In the second mode, the storage block 220 may store the first to third lower bit signals CNT_CDS<1:3> and the first to third upper bit signals CNT_CDS<4:6> for the transition period.

According to such a second embodiment with the second mode, advantages may be provided in that power consumption may be optimized, while achieving the advantages according to the first embodiment with the first mode.

Hereinbelow, descriptions will be made for an image sensor to which one embodiment of the present disclosure is applied. While only an image sensor to which the first embodiment of the present disclosure is applied will be described below for the sake of convenience in explanation, it is to be noted that the second embodiment of the present disclosure may also be applied.

Figure 10:
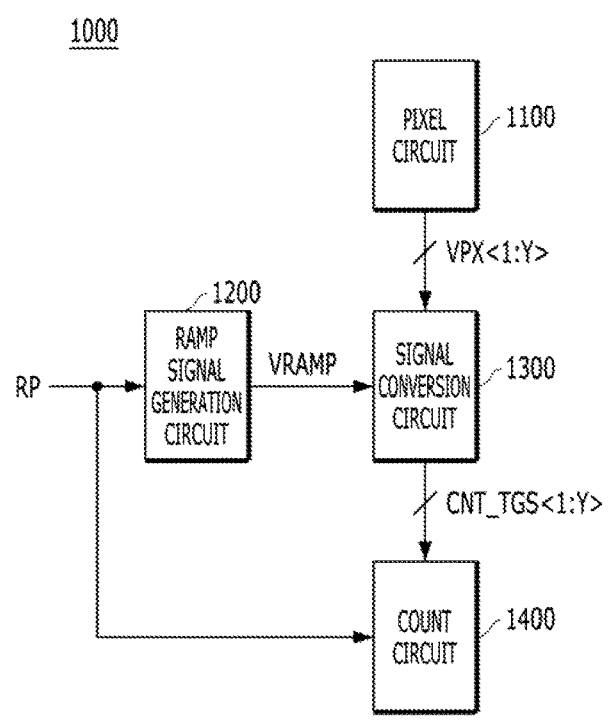
FIG. 10 is a diagram illustrating an example of an image sensor to which the count circuit shown in FIG. 1 is applied.

FIG. 10 is a diagram illustrating an example of an image sensor 1000 to which the count circuit in accordance with the first embodiment is applied.

Referring to FIG. 10, the image sensor 1000 may include a pixel circuit 1100, a ramp signal generation circuit 1200, a signal conversion circuit 1300, and a count circuit 1400.

The pixel circuit 1100 may include a plurality of pixels which are arranged in rows and columns. For example, the pixel circuit 1100 may include Y*Z number of pixels (where Y and Z are natural numbers). In this case, the pixel circuit 1100 may generate first to $Y^{th}$ pixel signals VPX<1:Y> by rows for every unit row time.

The ramp signal generation circuit 1200 may generate a ramp signal VRAMP which has a predetermined pattern, for every unit row time, based on a ramp control signal RP.

The signal conversion circuit 1300 may generate first to $Y^{th}$ count target signals CNT_TGS<1:Y> based on the first to $Y^{th}$ pixel signals VPX<1:Y> and the ramp signal VRAMP. For example, the signal conversion circuit 1300 may include first to $Y^{th}$ analog-to-digital (A/D) converters for comparing the respective first to $Y^{th}$ pixel signals VPX<1:Y> and the ramp signal VRAMP and generating the respective first to $Y^{th}$ count target signals CNT_TGS<1:Y>.

The count circuit 1400 may count the respective first to $Y^{th}$ count target signals CNT_TGS<1:Y> based on the ramp control signal RP, and store first to $Y^{th}$ individual count code signals corresponding to counting results.

Figure 11:
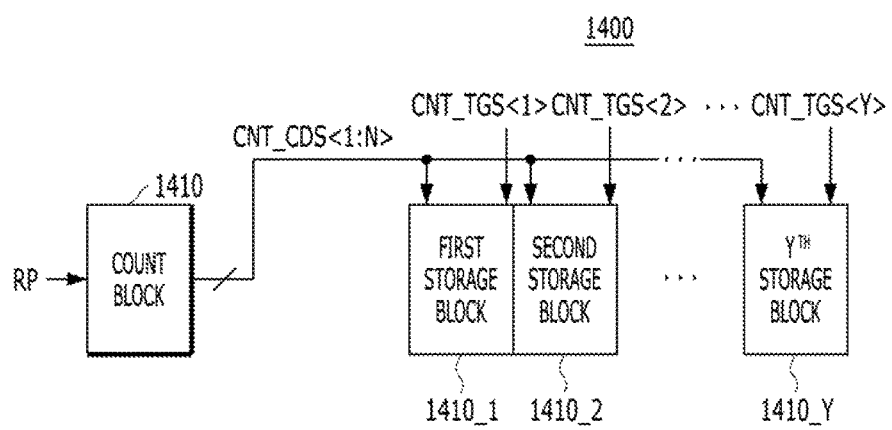
FIG. 11 is a diagram illustrating an example of the count circuit shown in FIG. 10.

FIG. 11 is a diagram illustrating an example of the count circuit 1400 shown in FIG. 10.

Referring to FIG. 11, the count circuit 1400 may include a count block 1410 and first to $Y^{th}$ storage blocks 1410_1 to 1410_Y.

The count block 1410 may generate common count code signals CNT_CDS<1:N> for a predetermined count period, based on the ramp control signal RP. Since the count block 1410 is the same as the count block 110 shown in FIG. 1, detailed descriptions thereof will be omitted herein.

The first to $Y^{th}$ storage blocks 1410_1 to 1410_Y may store the common count code signals CNT_CDS<1:N> as the first to $Y^{th}$ individual count code signals, based on the first to $Y^{th}$ count target signals CNT_TGS<1:Y>, respectively. Since each of the first to $Y^{th}$ storage blocks 1410_1 to 1410_Y is the same as the storage block 120 shown in FIG. 1, detailed descriptions thereof will be omitted herein.

Figure 12:
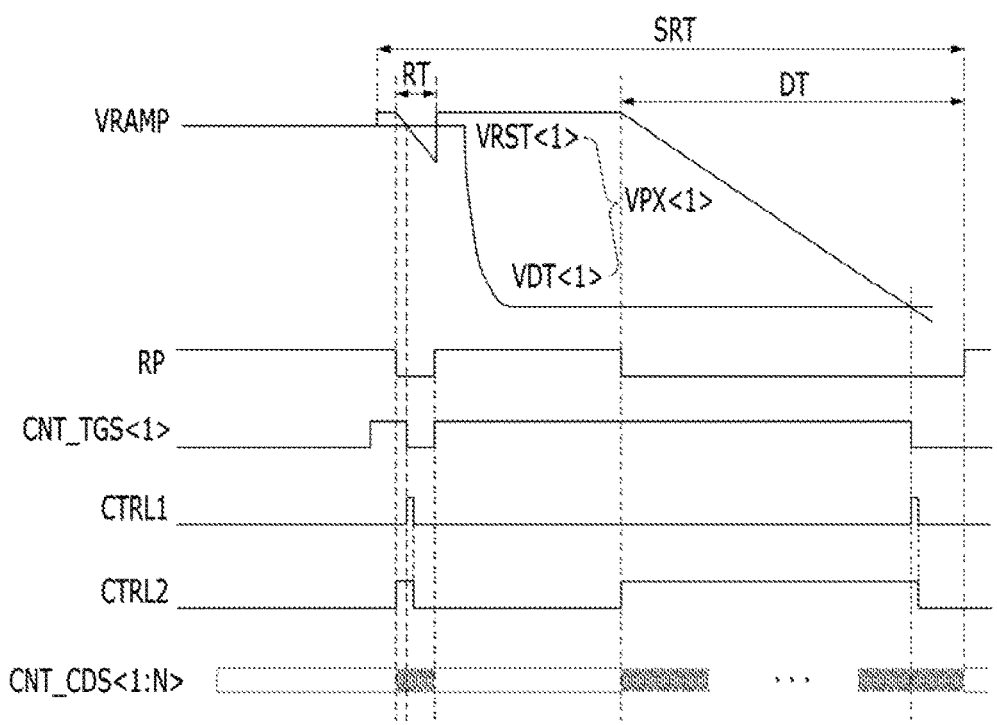
FIG. 12 is a timing diagram illustrating the operation of the image sensor shown in FIG. 10.

FIG. 12 is a timing diagram illustrating the operation of the image sensor 1000 shown in FIG. 10. It is to be noted that only the operation associated with the first pixel signal VPX<1> is shown in FIG. 12 for the sake of convenience in explanation.

Referring to FIG. 12, the pixel circuit 1100 may generate the first pixel signal VPX<1> corresponding to incident light for a unit row time SRT. For example, the pixel circuit 1100 may generate a first reset signal VRST<1> corresponding to a noise component reflected on the first pixel signal VPX<1>, as the first pixel signal VPX<1>, for a reset time RT of the unit row time SRT, and then generate a first data signal VDT<1> corresponding to the incident light, as the first pixel signal VPX<1>, for a data time DT of the unit row time SRT.

The ramp signal generation circuit 1200 generates the ramp signal VRAMP which has the predetermined pattern, for the unit row time SRT, based on the ramp control signal RP. For example, the ramp signal generation circuit 1200 may generate the ramp signal VRAMP which ramps within a reset voltage range for the reset time RT and ramps within a data voltage range for the data time DT.

The signal conversion circuit 1300 may generate the first count target signal CNT_TGS<1> by comparing the first pixel signal VPX<1> and the ramp signal VRAMP. For example, the signal conversion circuit 1300 may generate the first count target signal CNT_TGS<1> with a logic high level when the voltage level of the ramp signal VRAMP is higher than the voltage level of the first pixel signal VPX<1>, and generate the first count target signal CNT_TGS<1> with a logic low level when the voltage level of the ramp signal VRAMP is lower than the voltage level of the first pixel signal VPX<1>.

The count circuit 1400 may generate the common count code signals CNT_CDS<1:N> for the reset time RT and the data time DT, based on the ramp control signal RP. Each of the reset time RT and the data time DT may correspond to the count period. The count circuit 1400 may store the common count code signals CNT_CDS<1:N> as the first individual count code signals, for the reset time RT and the data time DT, based on the first count target signal CNT_TGS<1>. In detail, for the reset time RT, the count circuit 1400 may store lower bit signals among the plurality of bit signals included in the common count code signals CNT_CDS<1:N>, for a predetermined first period corresponding to the transition time of the first count target signal CNT_TGS<1>, and store upper bits signals among the plurality of bit signals, for at least a first earlier period earlier than the transition time of the first count target signal CNT_TGS<1>. Further, for the data time DT, the count circuit 1400 may store the lower bit signals for a predetermined second period corresponding to the transition time of the first count target signal CNT_TGS<1>, and store the upper bits signals for at least a second earlier period earlier than the transition time of the first count target signal CNT_TGS<1>. Since the operation of the count circuit 1400 associated therewith is the same as the operation of the count circuit 100 as shown in FIG. 4, detailed descriptions thereof will be omitted herein. For reference, the first individual count code signals may be signals which include the first to third lower latch signals CNT_LATS<1:3> and the first to third upper latch signals CNT_LATS<4:6> shown in FIG. 4.

As is apparent from the above descriptions, according to the embodiment of the present disclosure, advantages are provided in that average power to be continuously produced in a storage operation may be minimized by momentarily storing bit signals of relatively high frequencies and peak power to be momentarily produced in the storage operation may be minimized by continuously storing bit signals of relatively low frequencies.

Moreover, according to the embodiment of the present disclosure, advantages are provided in that average power or peak power may be selectively minimized by momentarily storing or continuously storing bit signals of relatively low frequencies depending on a mode.

Although various embodiments have been described for illustrative purposes, it will be apparent to those skilled in the art that various changes and modifications may be made without departing from the spirit and scope of the invention as defined in the following claims.

What is claimed is:

1. A count circuit comprising:
a count block suitable for generating count code signals for a predetermined count period including a first period and a second period; and
a storage block suitable for storing first bit signals among a plurality of bit signals included in the count code signals, for the first period, and storing remaining bit signals among the plurality of bit signals for the second period,
wherein the storage block comprises:
a controller suitable for generating a first control signal which is activated for the first period and a second control signal which is activated for the second period, based on a count target signal;
a plurality of first storage units, each suitable for storing the first bit signals based on the first control signal, respectively; and
a plurality of second storage units, each suitable for storing the remaining bit signals based on the second control signal, respectively,
wherein the second control signal is deactivated together when the first control signal is deactivated.

2. The count circuit according to claim 1, wherein the second period includes the first period.

3. The count circuit according to claim 1,
wherein the first period includes a predetermined period corresponding to a transition time of a count target signal in the count period, and
wherein the second period includes at least a period earlier than the transition time in the count period.

4. The count circuit according to claim 1,
wherein the first bit signals are lower bit signals which have relatively high frequencies, respectively, and
wherein the remaining bit signals are upper bit signals which have relatively low frequencies, respectively.

5. The count circuit according to claim 1, wherein the controller comprises:
a first control signal generation unit suitable for generating the first control signal which is activated for the first period corresponding to a transition time of the count target signal, based on the count target signal; and
a second control signal generation unit suitable for generating the second control signal which is activated for the second period including at least a period earlier than the transition period, based on the first control signal.

6. The count circuit according to claim 1, wherein the controller comprises:
a first control signal generation unit suitable for generating the first control signal which is activated for the first period corresponding to a transition time of the count target signal, based on the count target signal;
a third control signal generation unit suitable for generating a third control signal which is activated for the second period including at least a period earlier than the transition period, based on the first control signal; and
a selection unit suitable for selectively selecting any one of the first control signal and the third control signal as the second control signal, based on a mode select signal.

7. The count circuit according to claim 1,
wherein the first period is shorter than a single cycle of one of the first bit signals.

8. A method for operating a count circuit, comprising:
entering a first mode;
generating count code signals for a predetermined first count period;
storing some bit signals among a plurality of bit signals included in the count code signals, for a first period in the first count period, based on a first control signal; and
storing remaining bit signals among the plurality of bit signals, for a second period in the first count period, based on a second control signal,
wherein the storing of the some bit signals comprises:
generating the first control signal which is activated for a first period of the first count period, based on a count target signal; and
enabling a first storage block to store the some bit signals, for the first period, based on the first control signal, and
wherein the storing of the remaining bit signals comprises:
generating the second control signal which is activated for a second period of the first count period, based on the first control signal; and
enabling a second storage block to store the remaining bit signals, for the second period, based on the second control signal, and
wherein the second control signal is deactivated together when the first control signal is deactivated.

9. The method according to claim 8,
wherein the some bit signals include lower bit signals which have relatively high frequencies, respectively, and
wherein the remaining bit signals include upper bit signals which have relatively low frequencies, respectively.

10. The method according to claim 8, further comprising:
entering a second mode;
generating the count code signals for a predetermined second count period; and
storing the plurality of bit signals for a predetermined period corresponding to a second transition time of the count target signal in the second count period.

11. The method according to claim 10, wherein the storing of the plurality of bit signals comprises:
generating a first control signal which is activated for the predetermined period corresponding to the second transition time, based on the count target signal;
enabling a first storage block to store the some bit signals, for a first period of the second count period, based on the first control signal;
generating a third control signal which is activated for a second period of the second count period, based on the first control signal;
outputting the first control signal between the first control signal and the third control signal, as a second control signal, based on a mode select signal; and
enabling a second storage block to store the remaining bit signals, for the first period, based on the second control signal.

12. The method according to claim 8,
wherein the first period includes a predetermined period corresponding to a transition time of a count target signal in the first count period, and
wherein the second period includes at least a period earlier than the transition time in the first count period.

13. The method according to claim 8,
wherein the first period is shorter than a single cycle of one of the first bit signals.

14. An image sensor comprising:
a pixel circuit suitable for generating a plurality of pixel signals;
a ramp signal generation circuit suitable for generating a ramp signal;
a signal conversion circuit suitable for generating a plurality of count target signals based on the plurality of pixel signals and the ramp signal; and
a count circuit suitable for generating common count code signals, storing first bit signals among a plurality of bit signals included in the common count code signals, for a predetermined period corresponding to a transition time of each of the plurality of count target signals, and storing remaining bit signals among the plurality of bit signals, for at least a period earlier than the transition time, based on the plurality of count target signals,
wherein the count circuit comprises:
a count block suitable for generating the common count code signals for a predetermined count period; and
a plurality of storage blocks suitable for storing the common count code signals, based on the plurality of count target signals, and
wherein each of the plurality of storage blocks comprises:
a controller suitable for generating a first control signal which is activated for the predetermined period and a second control signal which is activated for the earlier period, based on each of the plurality of count target signals;
a first storage suitable for storing the first bit signals based on the first control signal; and
a second storage suitable for storing the remaining bit signals based on the second control signal, and
wherein the second control signal is deactivated together when the first control signal is deactivated.

15. The image sensor according to claim 14, wherein the earlier period includes the predetermined period.

16. The image sensor according to claim 14,
wherein the first bit signals include lower bit signals which have relatively high frequencies, respectively, and
wherein the remaining bit signals include upper bit signals which have relatively low frequencies, respectively.

17. The image sensor according to claim 14, wherein the controller comprises:
a first control signal generation unit suitable for generating the first control signal based on the plurality of count target signals; and
a second control signal generation unit suitable for generating the second control signal based on the first control signal.

18. The image sensor according to claim 14, wherein the count circuit stores the remaining bit signals for the earlier period or for the predetermined period, based on a mode select signal.

19. The image sensor according to claim 14,
wherein the first period is shorter than a single cycle of one of the first bit signals.

* * * * *